United States Patent
Piccardi

(10) Patent No.: US 11,380,408 B2
(45) Date of Patent: Jul. 5, 2022

(54) SELECTIVE OVERDRIVE OF SUPPLY VOLTAGE TO PRIMARY SWITCH FOR PROGRAMMING MEMORY CELLS

(71) Applicant: Micron Technology, Inc., Boise, ID (US)

(72) Inventor: Michele Piccardi, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 33 days.

(21) Appl. No.: 17/247,087

(22) Filed: Nov. 30, 2020

(65) Prior Publication Data
US 2022/0172789 A1 Jun. 2, 2022

(51) Int. Cl.
*G11C 16/10* (2006.01)
*G11C 16/30* (2006.01)
*G11C 16/04* (2006.01)

(52) U.S. Cl.
CPC .............. *G11C 16/30* (2013.01); *G11C 16/10* (2013.01); *G11C 16/0483* (2013.01)

(58) Field of Classification Search
CPC ...................................... G11C 16/10
USPC ................................................... 365/185.25
See application file for complete search history.

(56) References Cited

U.S. PATENT DOCUMENTS

2021/0182178 A1* 6/2021 Ehama ............... G06F 9/261

* cited by examiner

*Primary Examiner* — Jason Lappas
(74) *Attorney, Agent, or Firm* — Lowenstein Sandler LLP

(57) ABSTRACT

A circuit includes a linear regulator operatively coupled with a memory array, the linear regulator including a primary switch to generate a regulated voltage usable to program memory cells of the memory array. A first digital-to-analog converter (DAC) includes an output coupled with the linear regulator. A pump regulator is operatively coupled with a charge pump, where the charge pump is to provide a supply voltage to the linear regulator. A second DAC includes an output coupled with the pump regulator. Control logic, operatively coupled with the first DAC and the second DAC, is to perform operations including: causing a first digital input value to be provided to the first DAC to selectively smooth noise on the supply voltage; and causing a second digital input value to be provided the second DAC to selectively adjust the supply voltage based on a programmable offset value.

20 Claims, 9 Drawing Sheets

US 11,380,408 B2

SELECTIVE OVERDRIVE OF SUPPLY VOLTAGE TO PRIMARY SWITCH FOR PROGRAMMING MEMORY CELLS

TECHNICAL FIELD

Embodiments of the disclosure relate generally to memory sub-systems, and more specifically, relate to selective overdrive of supply voltage to primary switch for programming memory cells.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
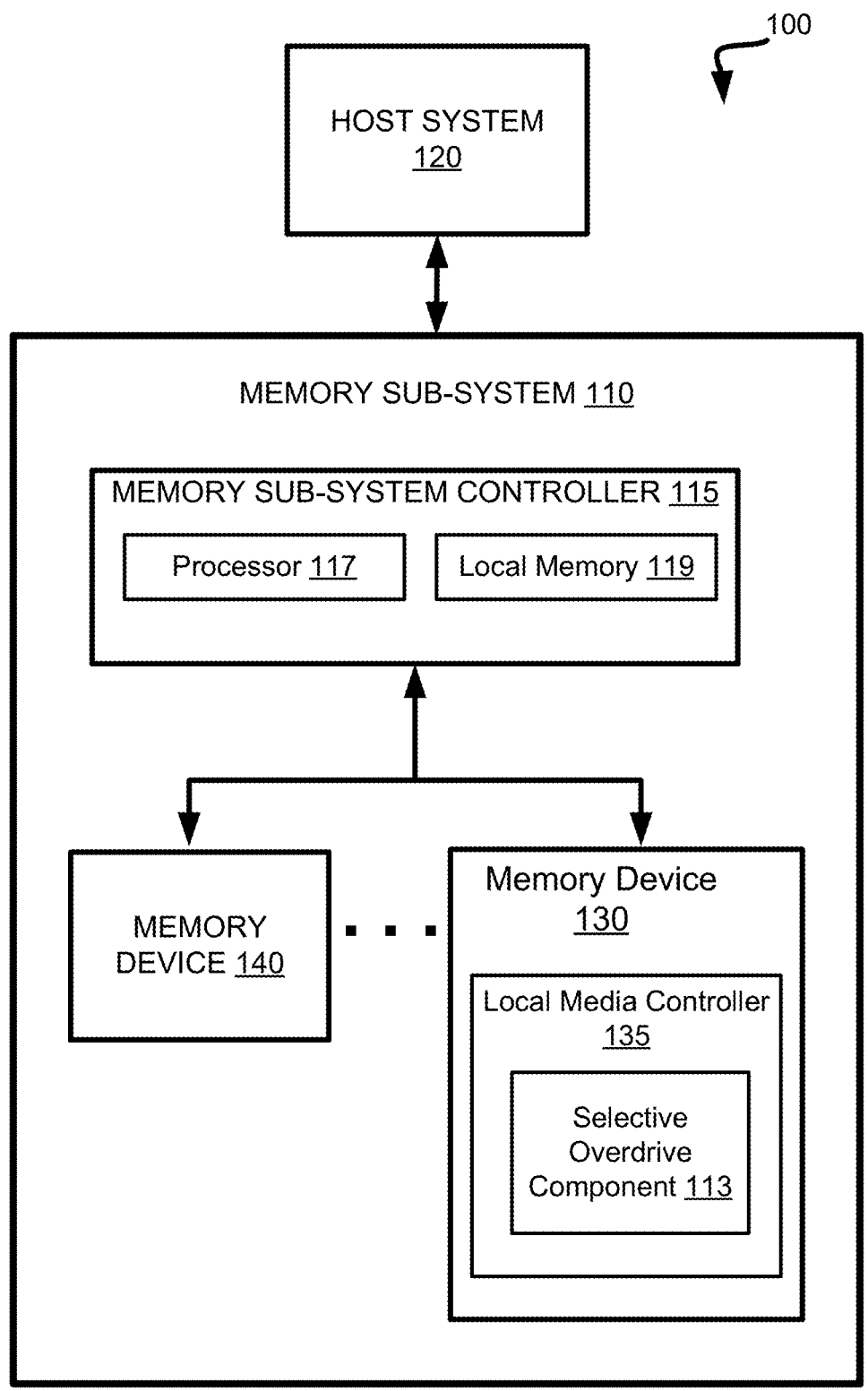
FIG. 1 is an example computing system that includes a memory sub-system in accordance with some embodiments.

Aspects of the present disclosure are directed to selective overdrive of supply voltage to primary switch for programming memory cells. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below with reference to FIG. 1. A non-volatile memory device is a package of one or more memory dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1," or combinations of such values.

A memory device can be made up of bits arranged in a two-dimensional grid or a three-dimensional grid. Memory cells are formed onto a silicon wafer in an array of columns (also hereinafter referred to as "bitlines") and rows (also hereinafter referred to as "wordlines"). A wordline can refer to one or more rows of memory cells of a memory device that are used with one or more bitlines to generate the address of each of the memory cells. The intersection of a bitline and wordline constitutes the address of the memory cell. In some embodiments, a local wordline (LWL) makes reference to a single row of memory cells that is individually programmable. Multiple local wordlines (LWLs), one per array block of memory, can be connected to a corresponding global wordline (GWL) in a many-to-one relationship, e.g., so that the corresponding LWLs can be controlled via a GWL, as will be discussed in detail.

To program data to a memory sub-system, a local media controller of a memory device can cause a voltage generated by an on-die charge pump and charge pump regulator to be applied across the gates of a NAND device to trap charges (e.g., electrons) in the floating gate of the NAND. The local media controller can cause the voltage be applied in one or more pulses, known as program pulses, to a wordline associated with memory cells. The amount of voltage and the width of each pulse can determine the amount of charge that will be stored at the NAND device, and in turn programs the state of a memory cell of the NAND. A series of pulses can be applied to a wordline in order to gradually raise the memory cell to target threshold voltage (Vt) while not over-programming the memory cell. The local media controller is to wait a pulse time (tP) to ensure each pulse reaches an end of the wordline, which can require that the program voltage of a pulse is fully passed from a GWL to a LWL without voltage loss.

Thus, the local media controller is to pass the program voltage from the GWL to the LWL via a highest possible program supply voltage (hereinafter "supply voltage") using a string driver (SD) transistor or similar powered switch or transistor. The SD transistor can be specially designed with certain specifications, e.g., a particular maximum gate-to-source voltage spec (Vgs), a particular maximum drain-to-source voltage spec (Vds), and particular threshold voltage spec parameters. These specifications continue to evolve due to scaling requirements on current and future nodes of the NAND memory, creating additional engineering costs and updates in order to meet these requirements. For example, if the gate voltage Vg is not sufficiently high, the SD transistor can fail to fully pass the program voltage onto the LWL. Thus, there is a need to track process, voltage, temperature (PVT) corner parameter values of the SD transistor and supporting circuitry to ensure adequate programming performance even at higher memory densities and/or low power.

In certain solutions to these evolving specifications and requirements, pump regulator circuitry of the local media controller can be adapted to switch one or more level shifter diodes into or out of a series arrangement with a string driver replica (SDf) transistor in order to provide a measure of overdrive voltage, when necessary, to the supply voltage. The SDf transistor can be designed to match the SD transistor to a level that the program supply voltage remains high enough relative to a regulated voltage put out on the GWL, although a perfect match is not possible. While switching in diode(s) within the pump regulator circuitry can provide a measure of overdrive in low power situations, there are physical limits to this design (particularly with higher supply voltages), the available overdrive is not very granular, and the on/off option leaves an open gap in the supply voltage that can cause programming glitches especially for the later program pulses within the program algorithm. Further, the addition of one or more diodes are low impedance paths; thus, a charge pump passes large ripple noise into the supply voltage, causing less-reliable program pulses of the program voltage.

Aspects of the present disclosure address the above and other deficiencies by having a memory device that includes a local media controller, which in turn is adapted to contain a linear regulator that includes a primary switch (e.g., transistor) to generate a regulated voltage usable to program memory cells of the memory array. This linear regulator can include an operational amplifier that is to drive a gate of the transistor based on closed-loop feedback from within the linear regulator and a first reference voltage. A first digital-to-analog converter (DAC) can include an output coupled to the linear regulator, e.g., to provide the first reference voltage. Control logic of the local media controller can cause a first digital input value to be provided to the first DAC to selectively smooth noise on a supply voltage of the transistor, as will be discussed in detail.

Further, the local media controller can include an updated pump regulator that includes a comparator to drive the charge pump, which in turn provides the supply voltage to the linear regulator. The comparator can drive the charge pump based on inputs from a closed-loop feedback voltage internal to the pump regulator and based on a second reference voltage. A second DAC can include an output coupled with the pump regulator, e.g., to provide the second reference voltage. The control logic of the local media controller can cause a second digital input value to be provided to the second DAC to selectively adjust the supply voltage based on a programmable offset value. The programmable offset value can then be adapted and dynamically programmed to account for effects such as a body effect mismatch between the SD transistor and one or more diodes (e.g., SDf transistor) of the pump regulator, a temperature coefficient value that compensates for a temperature of the memory device, or to lengthen certain program pulses to cause the charge pump to drive the supply voltage higher to boost performance of programming to the memory cells.

Therefore, advantages of the systems and methods implemented in accordance with some embodiments of the present disclosure include, but are not limited to, providing a highly granular, trimmable overdrive for the supply voltage, supports streamlined PVT tracking of the SDf versus the SD transistors, enables intelligent overdrive by way of varying the programmable offset, and significantly improves power supply rejection ratio (PSRR) from the supply voltage due to the amplifier functionality of the linear regulator. Other advantages will be discussed and still others will be apparent to those skilled in the art having the benefit of this disclosure.

FIG. 1 illustrates an example computing system 100 that includes a memory sub-system 110 in accordance with one or more embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address (e.g., logical block address (LBA), namespace) and a physical block address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In one embodiment, the memory device 130 includes a selective overdrive component 113 that can be used to manage selective overdrive of a supply voltage to a primary switch for programming memory cells of the memory device 130. In some embodiments, the local media controller 135 includes at least a portion of the selective overdrive component 113.

Figure 2A:
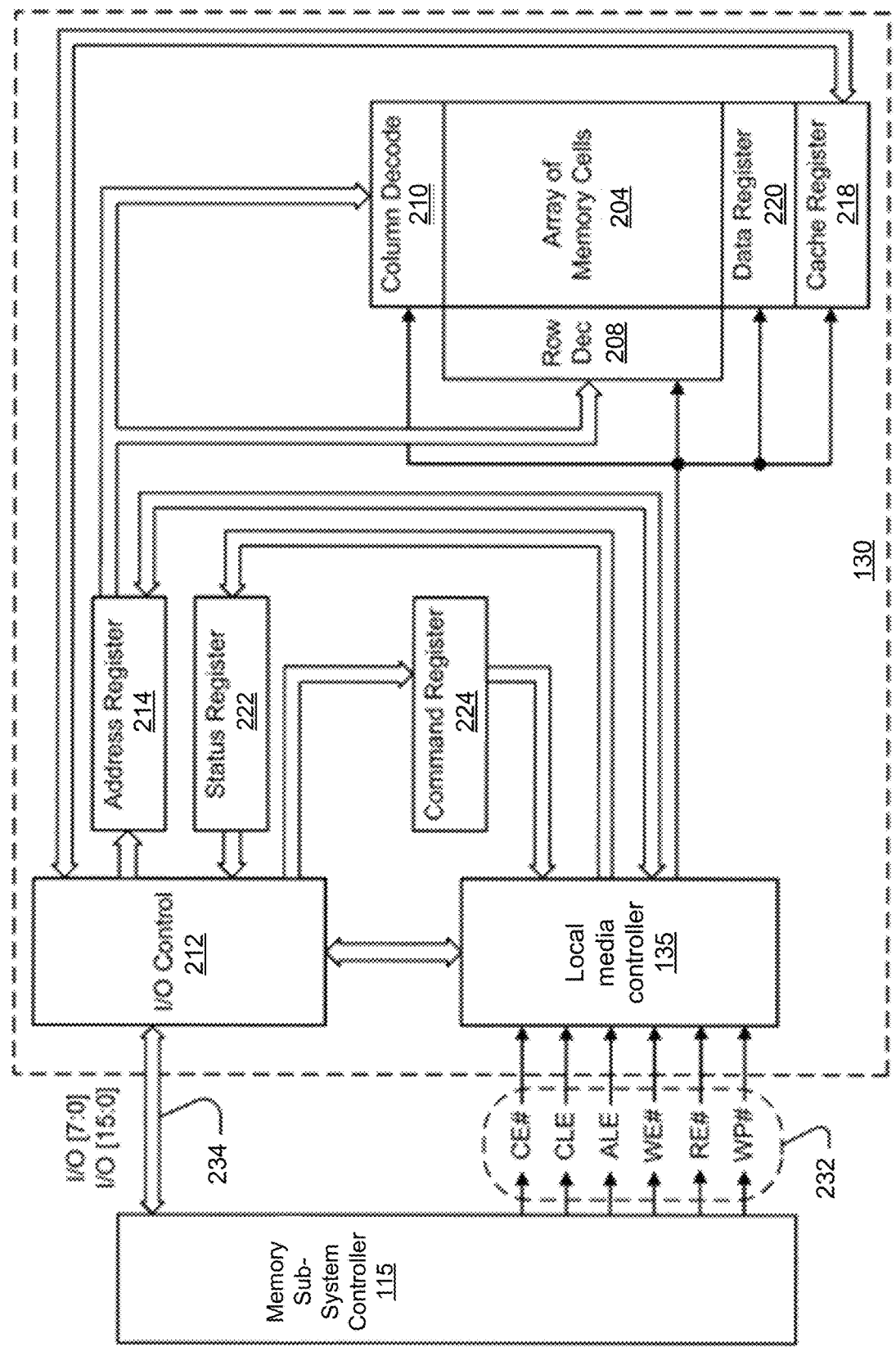
FIG. 2A is a block diagram of a memory device in communication with a memory sub-system controller of a memory sub-system, according to an embodiment.

FIG. 2A is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), can be a memory controller or other external host device.

Memory device 130 includes an array of memory cells 204 logically arranged in rows and columns. Memory cells of a logical row are typically connected to the same access line (e.g., a word line) while memory cells of a logical column are typically selectively connected to the same data line (e.g., a bit line). A single access line can be associated with more than one logical row of memory cells and a single data line can be associated with more than one logical column. Memory cells (not shown in FIG. 2) of at least a portion of array of memory cells 204 are capable of being programmed to one of at least two target data states.

Row decode circuitry 208 and column decode circuitry 210 are provided to decode address signals. Address signals are received and decoded to access the array of memory cells 204. Memory device 130 also includes input/output (I/O) control circuitry 212 to manage input of commands, addresses and data to the memory device 130 as well as output of data and status information from the memory device 130. An address register 214 is in communication with I/O control circuitry 212 and row decode circuitry 208 and column decode circuitry 210 to latch the address signals prior to decoding. A command register 224 is in communication with I/O control circuitry 212 and control logic 216 to latch incoming commands.

A controller (e.g., the local media controller 135 internal to the memory device 130) controls access to the array of memory cells 204 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 208 and column decode circuitry 210 to control the row decode circuitry 208 and column decode circuitry 210 in response to the addresses.

The local media controller 135 is also in communication with a cache register 218. Cache register 218 latches data, either incoming or outgoing, as directed by the local media controller 135 to temporarily store data while the array of memory cells 204 is busy writing or reading, respectively, other data. During a programming operation (e.g., write operation), data can be passed from the cache register 218 to the data register 22 for transfer to the array of memory cells 204; then new data can be latched in the cache register 218 from the I/O control circuitry 212. During a read operation, data can be passed from the cache register 218 to the I/O control circuitry 212 for output to the memory sub-system controller 115; then new data can be passed from the data register 220 to the cache register 218. The cache register 218 and/or the data register 220 can form (e.g., can form a portion of) a page buffer of the memory device 130. A page buffer can further include sensing devices (not shown in FIG. 2A) to sense a data state of a memory cell of the array of memory cells 204, e.g., by sensing a state of a data line connected to that memory cell. A status register 222 can be in communication with I/O control circuitry 212 and the local memory controller 135 to latch the status information for output to the memory sub-system controller 115.

Memory device 130 receives control signals at the memory sub-system controller 115 from the local media controller 135 over a control link 232. For example, the control signals can include a chip enable (CE#), a command latch enable (CLE), an address latch enable (ALE), a write enable (WE#), a read enable (RE#), and a write protect (WP#). Additional or alternative control signals (not shown) can be further received over control link 232 depending upon the nature of the memory device 130. Memory device 130 receives command signals (which represent commands), address signals (which represent addresses), and data signals (which represent data) from the memory sub-system controller 115 over a multiplexed input/output (I/O) bus 234 and outputs data to the memory sub-system controller 115 over I/O bus 234.

For example, the commands can be received over input/output (I/O) pins [7:0] of I/O bus 234 at I/O control circuitry 212 and can then be written into command register 224. The addresses can be received over input/output (I/O) pins [7:0] of I/O bus 234 at I/O control circuitry 212 and can then be written into address register 214. The data can be received over input/output (I/O) pins [7:0] for an 8-bit device or input/output (I/O) pins [15:0] for a 16-bit device at I/O control circuitry 212 and then can be written into cache register 218. The data can be subsequently written into data register 220 for programming the array of memory cells 204.

In an embodiment, cache register 218 can be omitted, and the data can be written directly into data register 220. Data can also be output over input/output (I/O) pins [7:0] for an 8-bit device or input/output (I/O) pins [15:0] for a 16-bit device. Although reference can be made to I/O pins, they can include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 2A has been simplified. It should be recognized that the functionality of the various block components described with reference to FIG. 2A may not necessarily be segregated to distinct components or component portions of an integrated circuit device. For example, a single component or component portion of an integrated circuit device could be adapted to perform the functionality of more than one block component of FIG. 2A. Alternatively, one or more components or component portions of an integrated circuit device could be combined to perform the functionality of a single block component of FIG. 2A.

Additionally, while specific I/O pins are described in accordance with popular conventions for receipt and output of the various signals, it is noted that other combinations or numbers of I/O pins (or other I/O node structures) can be used in the various embodiments.

Figure 2B:
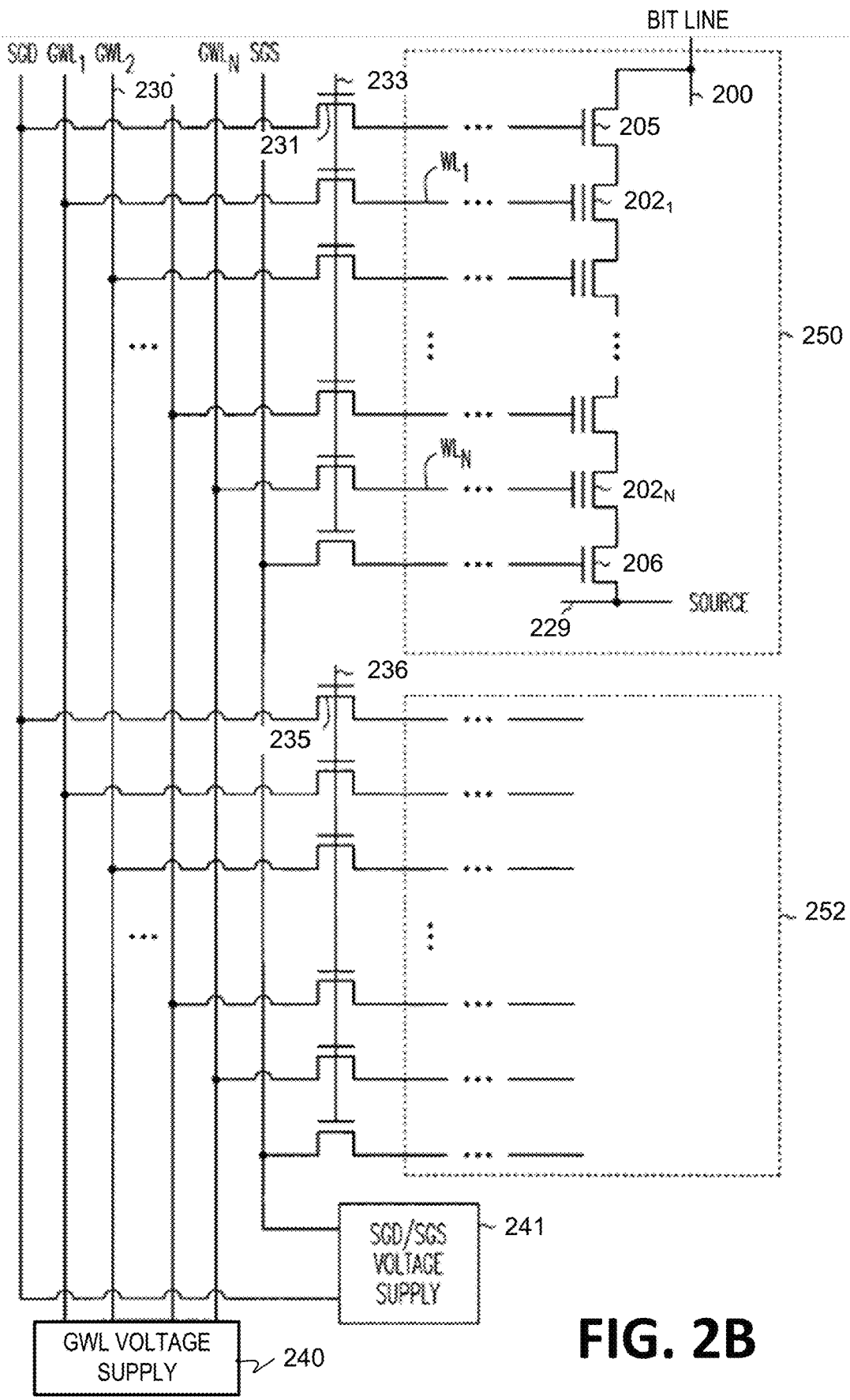
FIG. 2B illustrates a simplified portion of the memory array of the memory device of FIG. 2A, according to some embodiments.

FIG. 2B illustrates a simplified portion of the array of memory cells 204 of the memory device 130 of FIG. 2A, according to some embodiments. For simplicity, two array blocks 250 and 252 are illustrated. For purposes of explaining operation of the memory block, 250 is referred to herein as being a selected block because a memory cell in that block is selected for programming. Block 252 is referred to herein as being an unselected block because it does not contain the memory cell selected for programming.

In array block 250, a bit line 200 is coupled to a series of non-volatile floating gate transistor memory cells $202_1$-$202_n$ via drain select transistor 205. The memory cells are coupled to a source line 229 via a source select transistor 206. Control gates of the memory cells are coupled to wordlines ($WL_1$-$WL_n$), which are also referred to as local wordlines (LWL).

Each LWL can be selectively coupled to one of multiple global wordlines (GWL) 230 through a driver transistor 231. For example, each of the local wordlines $WL_1$ of each array block 250 and 252 can be coupled to $GWL_1$, each of the local wordlines $WL_2$ of each array block 250 and 252 can be coupled to $GWL_2$, and so forth through local wordlines $WL_n$ being coupled to $GWL_n$. In this way, each global wordline (GWL) can separately control corresponding local wordlines (LWLs) from each array block. Each GWL is coupled to receive voltages from a voltage supply 240. A voltage supply 241 is coupled to provide a gate voltage to the drain select transistor 205 and the source select transistor 206.

During operation, the gate 233 of driver transistors 231 of array block 250 are controlled to couple all of the wordlines (LWL) of a NAND group of memory cells to selected voltage levels. The term global wordlines (GWL) refers to the hierarchical structure of wordline conductors. As such, the GWLs are used to provide signals to multiple wordlines (LWL) of the array. Block 252, and any other unselected blocks in the array, are coupled to a wordline pre-charge voltage through driver transistors 235 and a respective driver gate signal on gate 236.

In embodiments, LWL of selected and unselected blocks are pre-charged to a low level, such as one volt. The pre-charge voltage can be coupled through the GWLs 230 and driver transistors 231 and 235, or a secondary biasing circuit. Further, the pre-charge operation can be limited to the unselected blocks in some embodiments.

Figure 3A:
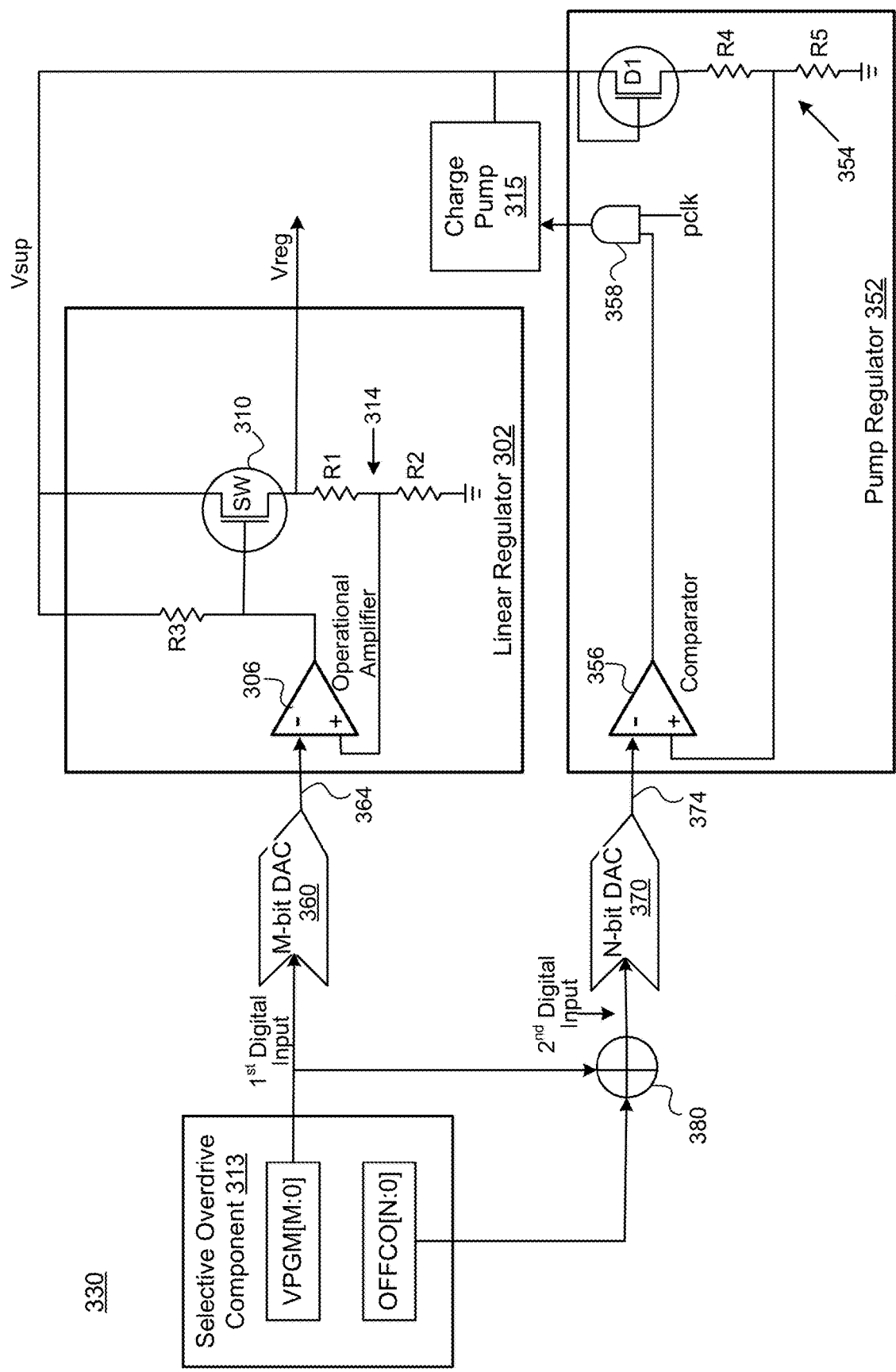
FIGS. 3A-3B are a block diagram of an example memory device having a selective overdrive component according to various embodiments.
Figure 3B:
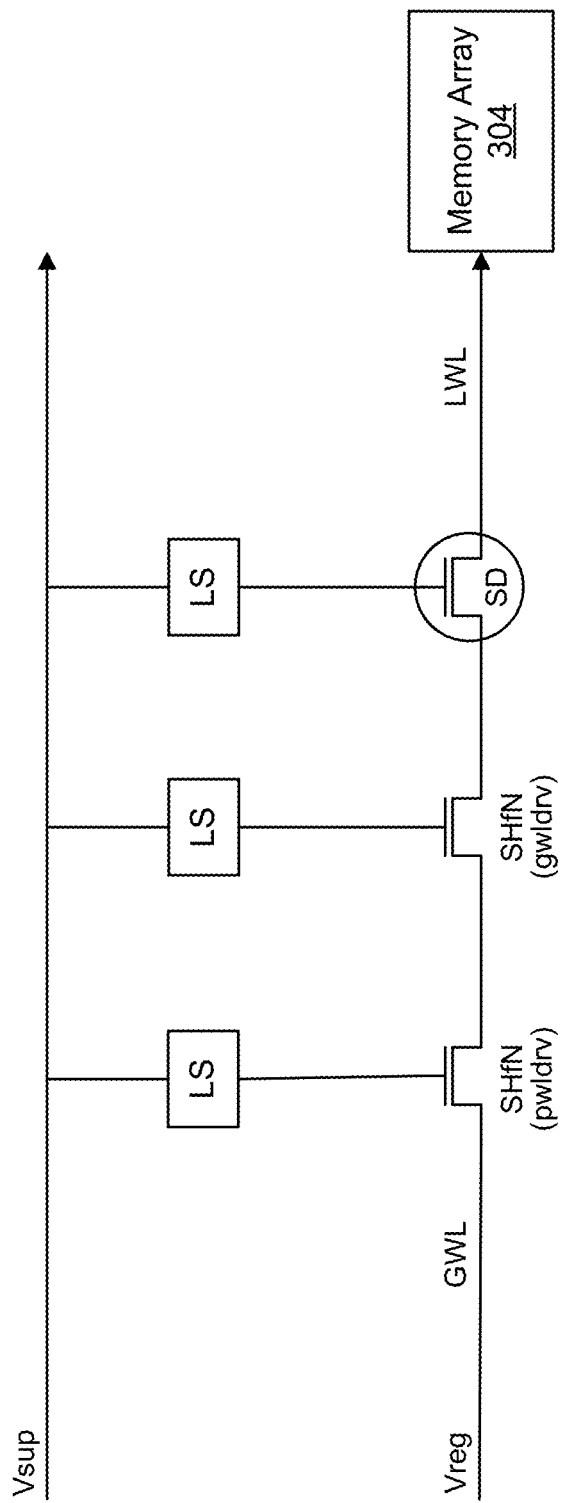

FIGS. 3A-3B are a block diagram of an example memory device 330 having a selective overdrive component 313 according to various embodiments. In one embodiment, the memory device 330 is the memory device 130 of FIGS. 1-2, and the selective overdrive component 313 is the selective overdrive component 113 included within the local media controller 135 discussed with reference to FIGS. 1-2. In various embodiments, the memory device 330 includes a linear regulator 302, a pump regulator 352, a charge pump 315, a first digital-to-analog converter (DAC) 360, a second DAC 370, and an adder 380. In some embodiments, the charge pump 315 supplies a supply voltage (Vsup) to the linear regulator 302 in order to drive the circuitry of the linear regulator 302 to generate a regulated voltage (Vreg).

In these embodiments, the linear regulator 302 includes, but is not limited to, an operational amplifier 306 with an output coupled with a primary switch 310. The primary switch 310 is also referred to herein as a transistor herein. For example, the primary switch 310 can be an n-type complementary metal oxide semiconductor (NMOS) transistor having a gate coupled with an output of the operational amplifier 306. In other embodiments, the primary switch is a p-type, or PMOS transistor with complementary changes of circuitry in the linear regulator 302. Thus, the output at the source of the primary switch 310 can be the output of the linear regulator 302, e.g., the regulated voltage (Vreg) useable to program memory cells of a memory array 304 of the memory device 330, as illustrated in FIG. 3B.

In various embodiments, the output of the operational amplifier 306 drives a gate of the primary switch 310 based on inputs received, including a feedback voltage from the source of the primary switch 310 and a first reference voltage 364 from the first DAC 360 that is programmed with a target program voltage. The linear regulator 302 can further include a voltage divider coupled between a source of the primary switch 310 and ground, where an output of the voltage divider 314 is the feedback voltage for the operational amplifier 306. The voltage divider 314 can include a first resistor (R1) and a second resistor (R2) while a third resistor (R3) can be coupled between the supply voltage (Vsup) and the output of the operational amplifier 306.

In some embodiments, the selective overdrive component 313 of the local media controller 335 provides (directly or indirectly through a driver) a first digital input value, VPGM [M:0], to the first DAC 360 to selectively smooth noise on the supply voltage (Vsup). This first digital input value can, for example, be an M-bit digital input value that encodes a particular program voltage at any given time. The operational amplifier 306 can then use the feedback voltage from the primary switch 310 in a closed-loop within the linear regulator 302 to smoothly adjust the supply voltage (Vsup) driving the primary switch 310 in order to reduce the noise ripple produced by the charge pump 315. In this way, the first digital input value, converted to an analog signal by the first DAC 360, selectively smooths noise on the supply voltage.

In various embodiments, and with continued reference to FIG. 3A, the pump regulator 352 can include a comparator 356, one or more diodes (D1) arranged in series, a voltage divider 354, and an AND gate 358. An output of the comparator 356 can drive the charge pump 315 based on inputs received, including a feedback voltage from the charge pump 315 and a reference voltage 374 from the second DAC 370. For purposes of timing, the AND gate 358 can perform a logical AND on the output of the comparator 356 with a pump clock (pclk) to ensure the charge pump 315 is only activated according to the control loop. In some embodiments, the voltage divider 354 is coupled between the one or more diodes (D1) and ground, where an output of the voltage divider 354 is the feedback voltage for the comparator 356. The voltage divider 354 can thus include a fourth resistor (R4) and a fifth resistor (R5).

In an embodiment, the one or more diodes (D1) are coupled with the charge pump 315 and the linear regulator 302. In one embodiment, the one or more diodes includes the string driver replica (SDf) transistor previously mentioned, along with one or more additional optional transistors acting as additional diode(s), together which provide an initial voltage level on top of which the charge pump 315 drives additional voltage onto the supply voltage. In some embodiments, D1 is the SDf transistor, which is substantially matched, as much as possible, to the string driver (SD) illustrated in FIG. 3B.

In some embodiments, the selective overdrive component 313 of the local media controller 135 provides (either directly or indirectly via a driver) a second digital input value to the second DAC 370 to selectively adjust the supply voltage (Vsup) based on a programmable offset value, e.g., OFFCO[N:0], where N is less than M. The term "OFFCO" is with reference to offset control, and this programmable offset value can be an N=8-bit value in one embodiment This 8-bit resolution can translate into a set of additional voltages, e.g., between 100 and 120 millivolts in various embodiments.

In various embodiments, the adder 380 is adapted to combine the first digital input value, e.g., VPGM[M:0], with the programmable offset value to generate the second digital input value. In some embodiments, the adder 380 is logic of the selective overdrive component 113, and thus is not necessarily located apart from the selective overdrive component 113, as illustrated. The most significant bit of the programmable offset value can be a sign bit. In this way, the programmable offset value is added to the first digital input value if positive or subtracted from the first digital input value if negative, enabling a higher or lower reference voltage to the pump regulator 352 of the charge pump.

Figure 4:
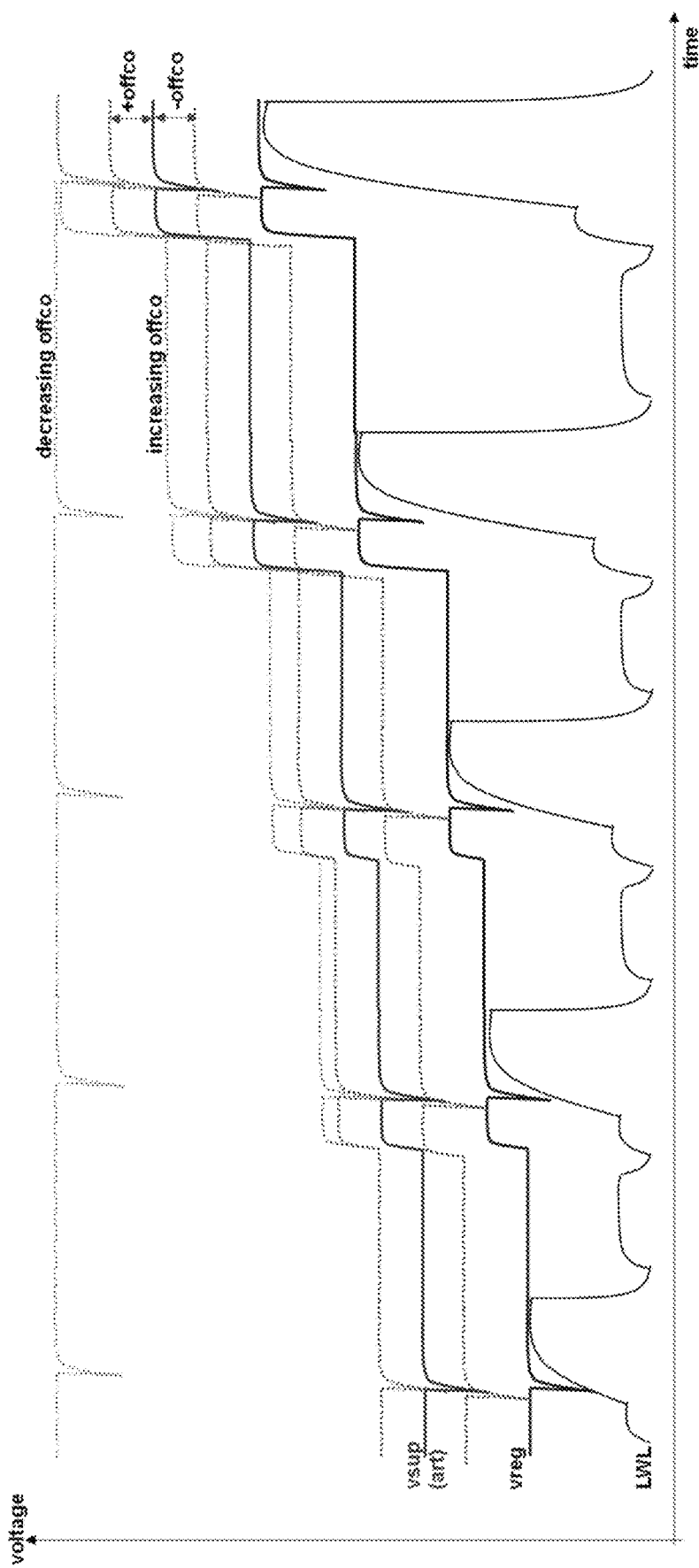
FIG. 4 is a graph including examples of how overdrive can be applied to a supply voltage as both a regulated voltage and a supply voltage vary with program algorithm execution, according to various embodiments.

FIG. 4 is a graph including examples of how overdrive, via the programmable offset value (OFFCO), can be applied to a supply voltage as both the regulated voltage (Vreg) and the supply voltage (Vsup) vary with program algorithm execution, according to various embodiments. For example, with an increase in the regulated voltage, an increase in the programmable offset value (OFFCO+) can cause an increase in the supply voltage sufficient to ensure the regulated voltage is fully passed onto the LWL. Further, with a decrease in the regulated voltage, a decrease in the programmable offset value (OFFCO−) can cause a decrease in the supply voltage so that the memory device 330 does not consume more power than necessary to pass the regulated voltage onto the LWL. In some embodiments, the OFFCO value starts with a constant (k) that normalizes a voltage offset that exists between the comparator 356 and the operational amplifier 306, and is further intelligently adjusted as will be discussed.

With continued reference to FIG. 3A, in some embodiments, the programmable offset value, illustrated as OFFCO[N:0], is intelligently updated according to one or more criteria that enable selective programming of the voltage programming circuitry of the local media controller 335. For example, the selective overdrive component 113 can encode, within the programmable offset value, a correction for a body effect mismatch between the SD transistor and the one or more diodes (D1) of the pump regulator 352. In one embodiment, the one or more diodes is the SDf transistor. Further, the selective overdrive component 113 can encode, within the programmable offset value, a temperature coefficient value that compensates for a temperature of the memory array 130A.

In related or separate embodiments, the selective overdrive component 113 can encode, within the programmable offset value, a lengthened pulse within the programmable offset value to cause the charge pump 315 to drive the supply voltage higher to reduce time to program the memory cells. For example, the lengthened pulse can cause an increase in the supply voltage (Vsup), which causes a higher gate voltage at the primary switch 310. The higher gate voltage lowers the transistor resistance, causing faster gate propagation of voltage, thereby decreasing programming time (Tprog).

To perform changes to supply voltage (Vsup) by way of updating the programmable offset value that feeds into the second digital input value being fed to the second DAC 370, the selective overdrive component 313 can encode the programmable offset value in a variety of ways. As a few examples, the encoding, within the programmable offset value, includes one of: a step function of pulse counts that iteratively causes the charge pump 315 to increase the supply voltage, e.g., in a stair-case fashion (see FIG. 4); a linear function of pulse counts that linearly causes the charge pump 315 to increase the supply voltage; or a selective function of pulse counts that selectively causes the charge pump 315 to increase the supply voltage depending on a pulse count value, for example. Additional or different encoding within the programmable offset value are envisioned.

FIG. 3B illustrates additional contextual circuitry by which the supply voltage (Vsup) and the regulated voltage (Vreg) power some additional switches at different levels, which ultimately supply the program voltage onto the local wordline (LWL). For example, the regulated voltage can be pushed over a global wordline (GWL) through a principal wordline driver (pwldrv), a global wordline driver (gwldrv), and a string driver (SD) transistor, the latter of which is to put the regulated voltage onto the LWL as a LWL voltage. The supply voltage can pass through one or more level shifter (LS) and be coupled to gates of the pwldrv, gwldrv, and SD transistor.

Figure 5:
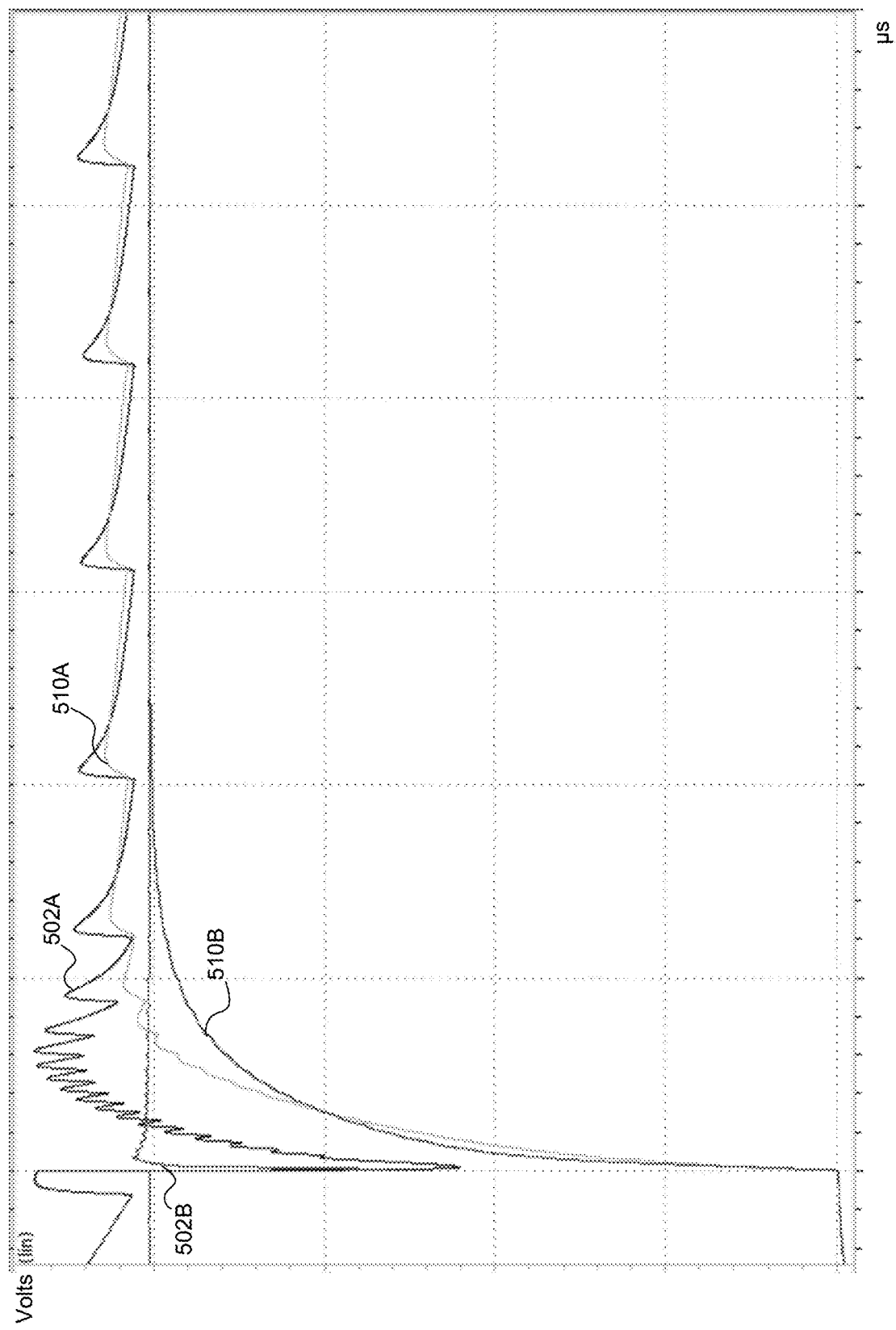
FIG. 5 is an example graph including a representation of a regulated voltage and local wordline (LWL) voltage before and after use of a linear regulator, in accordance with one or more embodiments.

FIG. 5 is an example graph including a representation of a regulated voltage and local wordline (LWL) voltage before and after use of a linear regulator, in accordance with one or more embodiments. A first line 502A illustrates a conventional regulated voltage before the regulator-based improvements made with reference to FIG. 2A. A second line 510A illustrates a conventional local wordline (LWL) voltage generated from the conventional regulated voltage. As can be observed, there is a significant amount of noise ripple passed from the conventional regulated voltage to the conventional LWL voltage.

With additional reference to FIG. 5, a third line 502B illustrates an improved regulated voltage based on the regulator-based improvement made with reference to FIG. 3A. A fourth line 510B illustrates an improved LWL voltage generated from the improved regulated voltage. As can be observed, the noise ripple on both of the improved regulated voltage and the resultant improved LWL voltage is many ten times less than that of the conventional regulated voltage and LWL voltage. This noise reduction can also tighten an upper tail of each threshold voltage distribution of programmed memory cells, thus also improving read-window budget (RWB), e.g., the voltage separation between threshold voltage levels.

Figure 6:
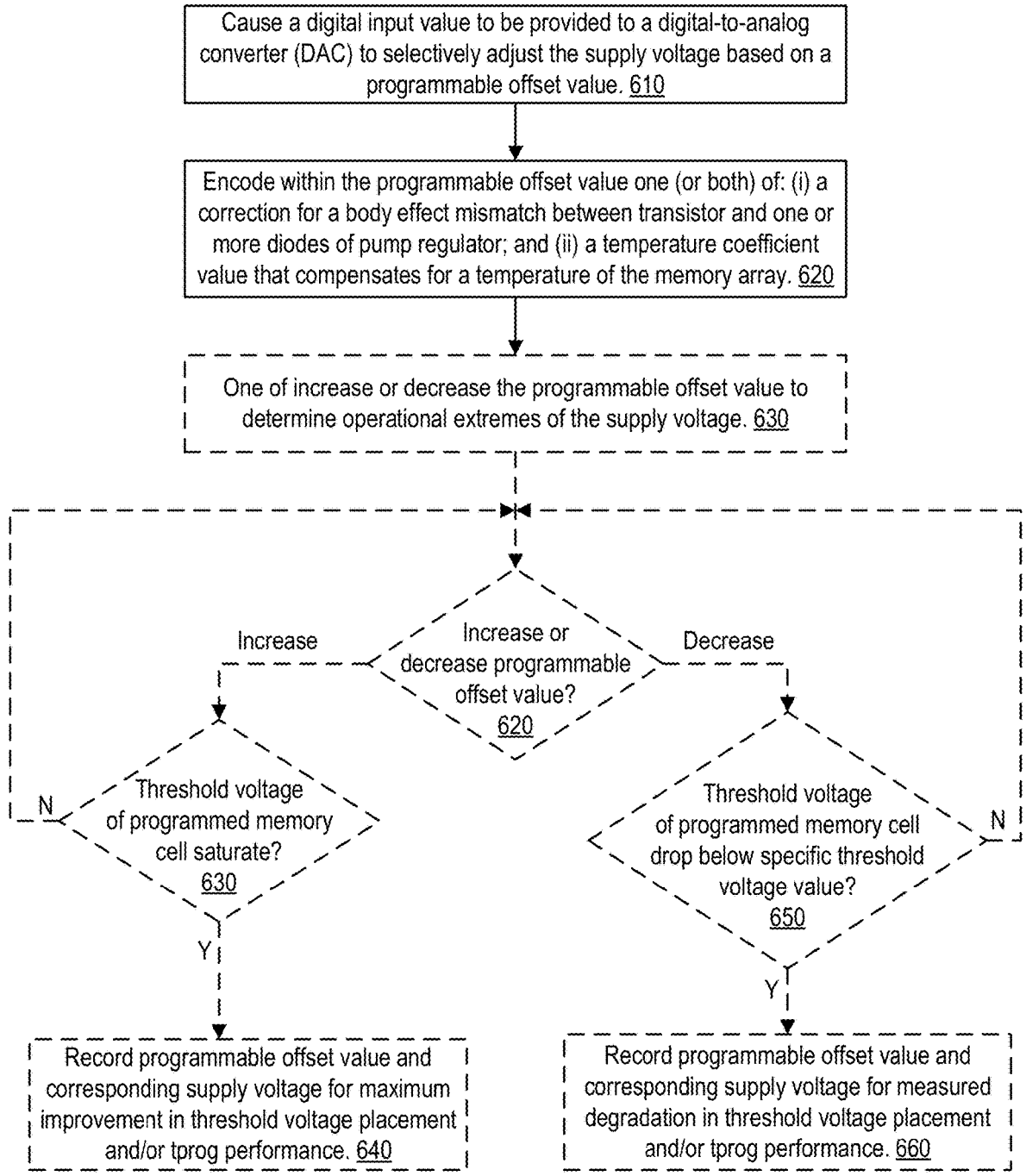
FIG. 6 is a flow diagram of an example method of selectively adjusting a supply voltage for programming memory cells based on a programmable offset value, in accordance with one or more embodiments.

FIG. 6 is a flow diagram of an example method 600 of selectively adjusting a supply voltage for programming memory cells based on a programmable offset value, in accordance with one or more embodiments. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the selective overdrive component 113 of FIG. 1 or by the selective overdrive component 313 of FIG. 3A. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 610, inputs are provided to a digital-to-analog converter (DAC). For example, the processing logic (e.g., the selective overdrive component 313) causes a digital input value to be provided to a DAC to selectively adjust the supply voltage based on a programmable offset value. In one embodiment, the DAC is the second DAC 370 that feeds the comparator 356, and the programmable offset value is the OFFCO[N:0] value (FIG. 2A).

At operation 620, the programmable offset value is set. For example, the processing logic encodes, within the programmable offset value one (or both) of: (i) a correction for a body effect mismatch between the string driver replica transistor (e.g., of the one or more diodes, D1) and the string driver (SD); or (ii) a temperature coefficient value that compensates for a temperature effect of the memory array.

At operation 630, the programmable offset value is updated. For example, the processing logic optionally one of increases or decreases the programmable offset value to determine operational extremes of the supply voltage. For example, if the processing logic increases the programmable offset value to drive the supply voltage higher, at operation 630, the processing logic further determines whether the threshold voltage placement of a programmed memory cell or the programming time (tprog) saturates. If the threshold voltage placement and/or programming time (tprog) saturates, there is no additional performance from increasing the programmable offset value any more. Accordingly, at operation 640, the processing logic records the programmable offset value and corresponding supply voltage for maximum improvement in threshold voltage.

By way of further example, if the processing logic decreases the programmable offset value to drive the supply voltage lower, at operation 650, the processing logic further determines whether the threshold voltage placement of the programmed memory cell drops below a specific threshold voltage value or if the programming time (tprog) increases. If the threshold voltage placement of the programmed cell drops below the specific threshold voltage value or the programming time (tprog) increases above the specific limit, at operation 660, the processing logic records the programmable offset value and corresponding supply voltage corresponding to the measured degradation.

Figure 7:
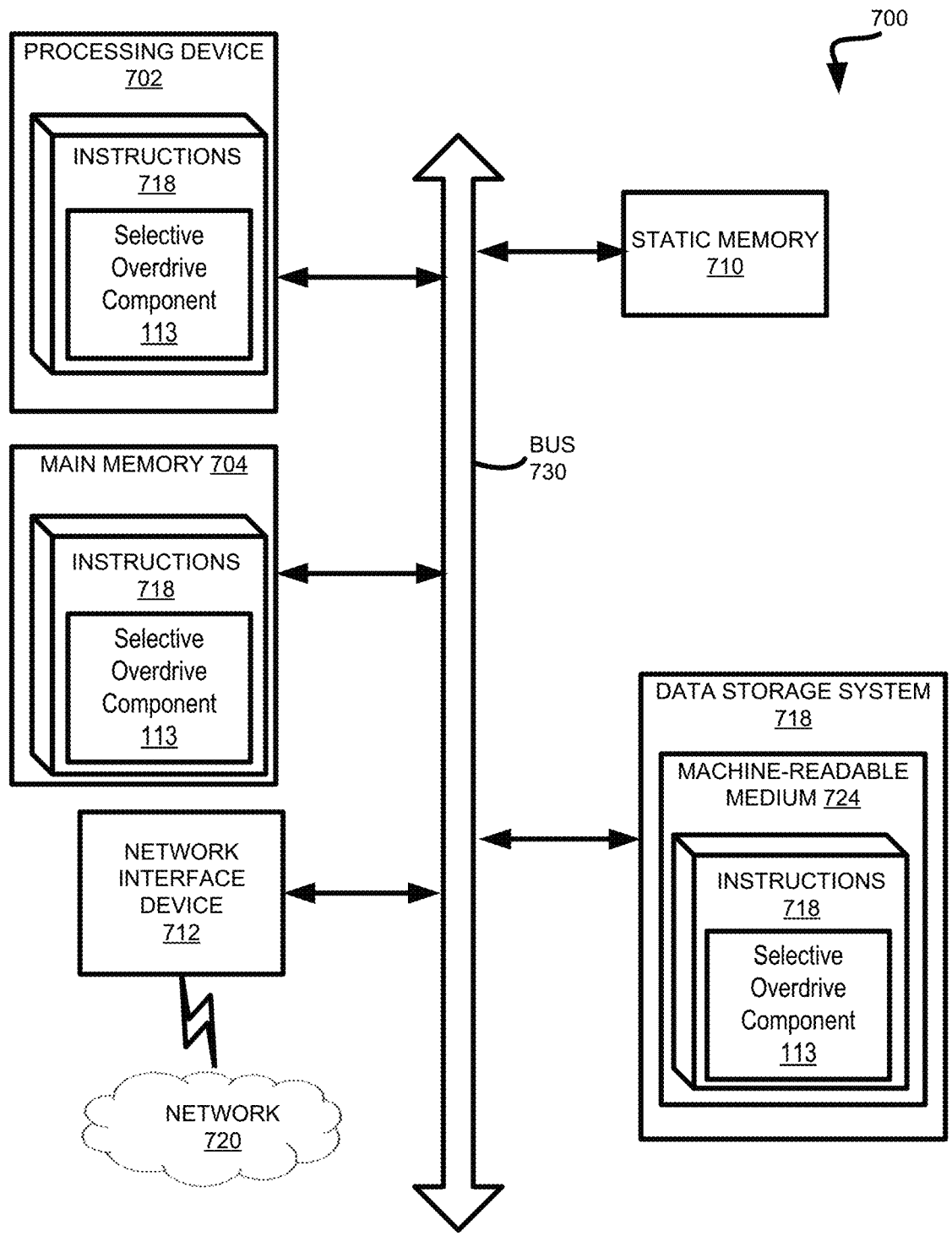
FIG. 7 is a block diagram of an example computer system in which implementations of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the selective overdrive component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a selective voltage overdrive (e.g., the selective overdrive component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium," or equally "non-transitory computer readable medium," shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A circuit comprising:
    a linear regulator operatively coupled with a memory array, the linear regulator comprising a primary switch to generate a regulated voltage usable to program memory cells of the memory array;
    a first digital-to-analog converter (DAC) having an output coupled with the linear regulator;
    a pump regulator operatively coupled with a charge pump, wherein the charge pump is to provide a supply voltage to the linear regulator;
    a second DAC having an output coupled with the pump regulator; and
    control logic, operatively coupled with the first DAC and the second DAC, the control logic to perform operations comprising:
        causing a first digital input value to be provided to the first DAC to selectively smooth noise on the supply voltage; and
        causing a second digital input value to be provided to the second DAC to selectively adjust the supply voltage based on a programmable offset value.

2. The circuit of claim 1, further comprising an adder to combine the first digital input value with the programmable offset value to generate the second digital input value.

3. The circuit of claim 1, wherein the pump regulator comprises:
    a comparator to drive the charge pump, the comparator to receive, as inputs, a feedback voltage from the charge pump and a reference voltage from the second DAC;
    one or more diodes coupled with the charge pump and the linear regulator; and
    a voltage divider coupled between the one or more diodes and ground, wherein an output of the voltage divider is the feedback voltage.

4. The circuit of claim 1, wherein the primary switch is a transistor, and wherein the linear regulator further comprises:
    an operational amplifier to drive a gate of the transistor, the operational amplifier to receive, as inputs, a feedback voltage from a source of the transistor and a reference voltage from the first DAC that is programmed with a target program voltage; and
    a voltage divider coupled between the source of the transistor and ground, wherein an output of the voltage divider is the feedback voltage.

5. The circuit of claim 4, wherein the primary switch is an n-type complementary metal oxide semiconductor (NMOS) transistor having a gate coupled with an output of the operational amplifier.

6. The circuit of claim 1, wherein the operations further comprise encoding, within the programmable offset value, one of:
    a correction for a body effect mismatch between a string driver replica transistor coupled with the charge pump and a string driver transistor; or
    a temperature coefficient value that compensates for a temperature of the memory array.

7. The circuit of claim 1, wherein the operations further comprise encoding, within the programmable offset value, a lengthened pulse to cause the charge pump to drive the supply voltage higher to boost performance of programming to the memory cells.

8. The circuit of claim 1, wherein the operations further comprise encoding, within the programmable offset value, one of:
  a step function of pulse counts that iteratively causes the charge pump to increase the supply voltage;
  a linear function of pulse counts that linearly causes the charge pump to increase the supply voltage;
  a selective function of pulse counts that selectively causes the charge pump to increase the supply voltage depending on a pulse count value; or
  a combination thereof.

9. A memory device comprising:
  a memory array comprising memory cells;
  a linear regulator operatively coupled with the memory array, the linear regulator comprising a primary switch to generate a regulated voltage usable to program the memory cells;
  a first digital-to-analog converter (DAC) having an output coupled with the linear regulator;
  a comparator having an output that is coupled to a charge pump, the charge pump to provide a supply voltage to the linear regulator;
  a second DAC having an output coupled with the comparator; and
  control logic, operatively coupled with the first DAC and the second DAC, the control logic to perform operations comprising:
    causing a first digital input value to be provided to the first DAC to selectively smooth noise on the supply voltage; and
    causing a second digital input value to be provided to the second DAC to selectively adjust the supply voltage based on a programmable offset value.

10. The memory device of claim 9, further comprising an adder to combine the first digital input value with the programmable offset value to generate the second digital input value.

11. The memory device of claim 9, further comprising a pump regulator comprising:
  the comparator, which is to receive, as inputs, a feedback voltage from the charge pump and a reference voltage from the second DAC;
  one or more diodes coupled with the charge pump and the linear regulator; and
  a voltage divider coupled between the one or more diodes and ground, wherein an output of the voltage divider is the feedback voltage.

12. The memory device of claim 9, wherein the primary switch is a transistor, and wherein the linear regulator further comprises:
  an operational amplifier to drive a gate of the transistor, the operational amplifier to receive, as inputs, a feedback voltage from a source of the transistor and a reference voltage from the first DAC that is programmed with a target program voltage; and
  a voltage divider coupled between the source of the transistor and ground, wherein an output of the voltage divider is the feedback voltage.

13. The memory device of claim 9, wherein the operations further comprise encoding, within the programmable offset value, one of:
  a correction for a body effect mismatch between a string driver replica transistor coupled with the charge pump and a string driver transistor; or
  a temperature coefficient value that compensates for a temperature of the memory array.

14. The memory device of claim 9, wherein the operations further comprise encoding a lengthened pulse within the programmable offset value to cause the charge pump to drive the supply voltage higher to reduce time to program the memory cells.

15. The memory device of claim 9, wherein the operations further comprise encoding, within the programmable offset value, one of:
  a step function of pulse counts that iteratively causes the charge pump to increase the supply voltage;
  a linear function of pulse counts that linearly causes the charge pump to increase the supply voltage; or
  a selective function of pulse counts that selectively causes the charge pump to increase the supply voltage depending on a pulse count value.

16. A memory device comprising:
  a memory array comprising memory cells;
  a linear regulator operatively coupled with the memory array, the linear regulator comprising:
    a transistor to generate a regulated voltage to program the memory array; and
    an operational amplifier to drive a gate of the transistor, the operational amplifier to receive, as inputs, a feedback voltage from a source of the transistor and a reference voltage;
  a first digital-to-analog converter (DAC) having an output coupled with the linear regulator and to supply the reference voltage;
  a charge pump to provide a supply voltage to the linear regulator; and
  control logic, operatively coupled with the first DAC, the control logic to perform operations comprising causing a first digital input value to be provided to the first DAC to selectively smooth noise on the supply voltage.

17. The memory device of claim 16, wherein the output of the first DAC is programmed with a target program voltage, further comprising a voltage divider coupled between the source of the transistor and ground, wherein an output of the voltage divider is the feedback voltage.

18. The memory device of claim 16, further comprising a pump regulator operatively coupled with the charge pump, the pump regulator comprising:
  a comparator to drive the charge pump, the comparator to receive, as inputs, a feedback voltage from the charge pump and a second reference voltage from a second DAC;
  one or more diodes coupled with the charge pump and the linear regulator; and
  a voltage divider coupled between the one or more diodes and ground, wherein an output of the voltage divider is the feedback voltage.

19. The memory device of claim 18, further comprising the second DAC having an output coupled with the pump regulator, wherein the operations performed by the control logic further comprise causing a second digital input value to be provided to the second DAC to selectively adjust the supply voltage based on a programmable offset value.

20. The memory device of claim 19, further comprising an adder to combine the first digital input value with the programmable offset value to generate the second digital input value.

* * * * *